United States Patent
Birdsley et al.

(10) Patent No.: US 6,518,783 B1
(45) Date of Patent: Feb. 11, 2003

(54) CIRCUIT CONSTRUCTION IN BACK SIDE OF DIE AND OVER A BURIED INSULATOR

(75) Inventors: Jeffrey D. Birdsley, Austin, TX (US);
Michael R. Bruce, Austin, TX (US);
Brennan V. Davis, Austin, TX (US);
Rosalinda M. Ring, Austin, TX (US);
Daniel L. Stone, Cedar Park, TX (US);
Rama R. Goruganthu, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/864,669

(22) Filed: May 23, 2001

(51) Int. Cl.[7] ........................... H01L 21/66; G01R 31/02
(52) U.S. Cl. .......................... 324/763; 438/14
(58) Field of Search ................. 324/765, 768, 324/763, 769; 438/10, 14, 16, 18, 142, 270, 259

(56) References Cited

U.S. PATENT DOCUMENTS 6,281,025 B1 * 8/2001 Ring et al. .................. 250/307
6,300,145 B1 * 10/2001 Birdsley et al. ............ 324/768

* cited by examiner

Primary Examiner—Christine Oda
Assistant Examiner—James Kerveros

(57) ABSTRACT

According to an example embodiment of the present invention, a semiconductor die having a buried insulator layer between a circuit side and a back side is selectively thinned. During thinning, a selected portion of the bulk silicon layer on the back side is removed and a void created. A circuit is formed in the void and is coupled to the existing circuitry on the circuit side of the die. The new circuit is used to analyze the die during operation, testing, or other conditions. The newly formed circuit enhances the ability to analyze the semiconductor die by adding flexibility to the traditional analysis methods used for integrated circuit dice. The newly formed circuit enables many new ways of interactively using the existing circuitry some of which include replacement of defective circuitry, modification of existing circuit operations, and stimulation of existing circuitry for testing.

22 Claims, 5 Drawing Sheets

CIRCUIT CONSTRUCTION IN BACK SIDE OF DIE AND OVER A BURIED INSULATOR

FIELD OF THE INVENTION

The present invention relates generally to semiconductor devices and their fabrication and, more particularly, to post manufacturing analysis of semiconductor devices including analyzing and debugging circuitry within an integrated circuit.

BACKGROUND OF THE INVENTION

Recent technological advances in the semiconductor industry have permitted dramatic increases in circuit density and complexity, and commensurate decreases in power consumption and package sizes for integrated circuit devices. Single-chip microprocessors now include many millions of transistors operating at speeds of hundreds of millions of instructions per second to be packaged in relatively small, air-cooled semiconductor device packages. A byproduct of these technological advances has been an increased demand for semiconductor-based products, as well as increased demand for these products to be fast, reliable, and inexpensive. These and other demands have led to increased pressure to manufacture a large number of semiconductor devices at an efficient pace while increasing the complexity and improving the reliability of the devices.

As the manufacturing processes for semiconductor devices and integrated circuits increase in difficulty, methods for manufacturing, testing and debugging these devices become increasingly important. Not only is it important to ensure that individual chips are functional, it is also important to ensure that batches of chips perform consistently. In addition, the ability to detect a defective manufacturing process early is helpful for reducing the possibility of manufacturing a defective device. It is also helpful to be able to perform the manufacture, testing and debugging of integrated circuits in an efficient and timely manner.

To increase the number of pad sites available for a die, to reduce the electrical path to the pad sites, and to address other problems, various chip-packaging techniques have been developed. One of these techniques is controlled collapse chip connection or "flip-chip" packaging. With this packaging technology, bonding pads on the die include metal (solder) bumps. Electrical connection to the package is made when the die is "flipped" over and soldered to the package. Each bump connects to a corresponding package inner lead. The resulting packages are low profile and have low electrical resistance and a short electrical path.

Once the die is attached to such a package, the back side portion of the die remains exposed. The transistors and other circuitry are generally formed in a very thin epitaxially grown silicon layer on a single crystal silicon wafer from which an individual die is later singulated. The side of the die including the epitaxial layer and containing the transistors and other circuitry is often referred to as the circuit side, or front side of the die. The circuit side of the die is positioned very near the package and opposes the back side of the die. Between the back side and the circuit side of the die is bulk silicon. In a structural variation, a layer of insulating material is formed on one surface of a single crystal silicon wafer followed by the thin epitaxially grown silicon layer into which the transistors and other circuitry is built. This wafer structure is termed silicon on insulator (SOI). A common insulating material is silicon dioxide. When silicon dioxide is used this layer is commonly called the buried oxide layer (BOX). The transistors formed on an SOI structure show decreased drain capacitance, resulting in a faster switching transistor.

In some instances the orientation of the die with the circuit side face down on a substrate may be a disadvantage, or present new challenges. For example, when a circuit fails, or when it is necessary to modify a particular chip, access to the transistors and circuitry near the circuit side may be possible only from the back side of the chip. This is challenging for SOI circuits since the transistors are in a thin layer of silicon covered by the buried oxide layer and the bulk silicon. Thus, the circuit side of the flip chip die is not visible or accessible.

One technique or method for testing and analysis of circuitry in an integrated circuit includes locating defective portions of the circuitry by controlling inputs to the die and monitoring outputs in order to determine if the die is operating as designed. Defective locations may be localized in a number of ways. One method includes the use of testing circuitry located in a die, such as built-in self test (BIST) circuitry including redundant or replacement circuitry. However, concerns about maximizing use of space while minimizing manufacturing costs preclude putting extensive circuitry into a die for the sole purpose of testing. Additionally, constructing a limited number of "test dice" containing testing circuitry is not effective because the test die will have a different design then the standard die and will not therefore necessarily function in the same manner.

SUMMARY OF THE INVENTION

The present invention is directed to a method for analyzing a semiconductor die using a circuit formed in a selected portion of a back side of a flip-chip die. The present invention is exemplified in a number of implementations and applications, some of which are summarized below.

According to an example embodiment of the present invention, a semiconductor die having a buried insulator layer between a circuit side and a back side is selectively thinned. During thinning, a selected portion of a bulk silicon substrate layer on the back side is removed and a void is created. A circuit is formed in the void and is coupled to pre-existing circuitry in the circuit side of the die. The formed circuit is used to analyze or modify the performance of the die during operation and testing. The new circuitry is used in a number of implementations that assist in analyzing the die. Selectively using the formed circuitry to modify the operation of, replace, or test the pre-existing circuitry provides flexibility in die testing and operation.

In one particular example embodiment of the present invention, the circuit formed in the back side is formed over an insulator portion of silicon on insulator (SOI) structure in the die. Enough substrate is removed to expose a portion of the insulator. The circuitry includes SOI circuitry and is formed over the insulator. In one implementation, the circuitry is formed directly on the insulator portion in the die, and in another implementation additional insulator material is formed in the back side and the circuitry is formed on the additional insulator. The formed circuitry exhibits benefits including those of SOI circuitry indicated in the Background hereinabove.

In another example embodiment of the present invention, a thinning arrangement is adapted to remove a selected portion of a silicon substrate layer from a back side of an integrated circuit die. This localized thinning creates a void into which a formation arrangement is adapted to form circuitry. A coupling arrangement communicatively couples the newly formed circuitry to the pre-existing circuitry of the integrated circuit die in a manner that allows modification, replacement, or testing of the pre-existing circuitry by the newly formed circuitry. An analysis arrangement is then adapted to use the newly formed circuitry and to perform analysis of the die.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
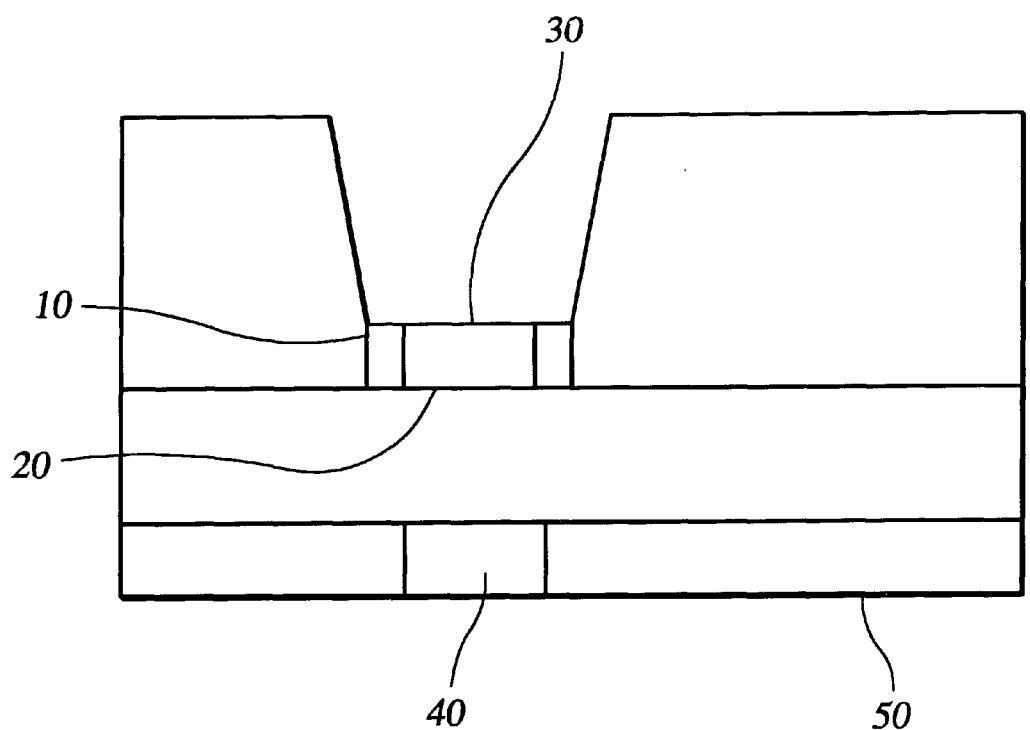
FIG. 1 is a flip-chip IC die with circuitry built in the back side, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable for a variety of different types of semiconductor devices, and has been found particularly suited to analysis of a flipchip integrated circuit die having SOI structure. While not necessarily limited to such devices, various aspects of the invention may be appreciated through a discussion of various examples using this context.

According to an example embodiment of the present invention, a semiconductor die having a buried insulator layer between a circuit side and a back side is selectively thinned on its back side. A removal process, such as a focused ion beam (FIB) etch, a laser etch or a polishing process, such as mechanical or chemical-mechanical polishing, is used to remove a portion of the back side of the silicon substrate. A selected portion of a bulk silicon substrate layer in the back side is removed and a void is created. A new circuit having silicon-on-insulator (SOI) structure is formed in the back side of the die in the void. In one implementation, construction of the new circuit having SOI structure involves using either the existing buried insulator of the die to form the new circuit with SOI structure, or forming additional insulator, and constructing the new circuit above the new insulator. The newly formed circuit having SOI structure constructed in a back side void of the die is coupled to pre-existing circuitry on the circuit side of the die. The new circuit is used to analyze the die, for example, during operation or testing.

The circuit can be formed in various portions of the die and used to effect various results. For instance, in one example embodiment of the present invention a back side of an integrated circuit die having SOI structure with silicon dioxide as the insulator is selectively thinned on the back side and a buried oxide layer (BOX) is exposed. Insulator material is added to the exposed BOX making it thicker and providing additional electrical insulation between the circuitry on the circuit side of the die and circuitry that will be formed on the back side. An epitaxial layer of silicon is formed over the expanded BOX. Circuitry is then formed in the epitaxial layer using a conventional circuit manufacturing process. The newly formed circuitry is electrically coupled to the circuitry located on the circuit side of the die via a conductor.

There are a number of uses for the newly formed circuitry in the analysis of the die. In one example embodiment, the new circuitry is used to replace pre-existing circuitry in the die suspected of containing a defect to either positively or negatively confirm the existence of the suspected defect. In a die which contains a defect, a circuit path suspected of containing the defect is replaced with the newly formed circuitry in the back side of the die. The die is operated, and the existence or nonexistence of a defect is detected. Elimination of a recurring failure by the replacement of a specific circuit element indicates the replaced circuit element contains a defect. If the newly formed circuitry eliminates the failure, the replaced circuit is identified as being defective. If the failure still occurs, the replaced circuitry is identified as not necessarily causing the failure. In this way selective replacement of portions of circuitry in the die assists in locating defects.

In another example embodiment, circuitry that is known to have been damaged, for instance during earlier analysis, is replaced by circuitry built in the void created in the back side of the die by localized thinning of the die. Circuitry is damaged during analysis, for example, when a buried circuit is accessed by removing circuitry overhead. The removed circuitry is replaced by circuitry in the back side of the die by coupling to the front side circuitry either before or after testing the accessed circuitry. The replacement of the damaged circuitry allows use and analysis of the undamaged portions of the integrated circuit die so that the die is not a loss. The back side circuitry is used to replace the damaged circuitry allowing the rest of the circuitry in the die to be tested instead of having to discard the chip or attempting to repair the damaged circuitry in the front side of the die.

In another example embodiment of the present invention, a programmable circuit is formed in the back side of the die and coupled to the front side circuitry. The programmable circuit provides programmability and hence, additional flexibility and uses for the back side circuitry. In one example, the back side programmable circuitry is used to stimulate the circuit side circuitry of the die including such things as biasing a gate or supplying a current or voltage.

In another example embodiment, FIG. 1 shows an integrated circuit die having circuitry in a back side of the die. A layer of silicon 10 is epitaxially grown on a buried insulator layer 20 that has been exposed by selective removal of back side silicon substrate. A circuit 30 is formed in the silicon epi-layer 10. The formed circuit 30 includes one or more circuit structures, such as a transistor containing a source region, a drain region, and a gate. The formed circuit 30 is selectively activatable and is used as a spare circuit, an additional circuit, and/or a replacement circuit. Formation of the circuitry on a thin epitaxial layer above an insulator layer provides additional advantages of an SOI structure including decreased drain capacitance resulting in faster switching times. The faster switching times are particularly useful for operating and analyzing dies at and above the operating speeds demanded in complex applications.

Figure 2:
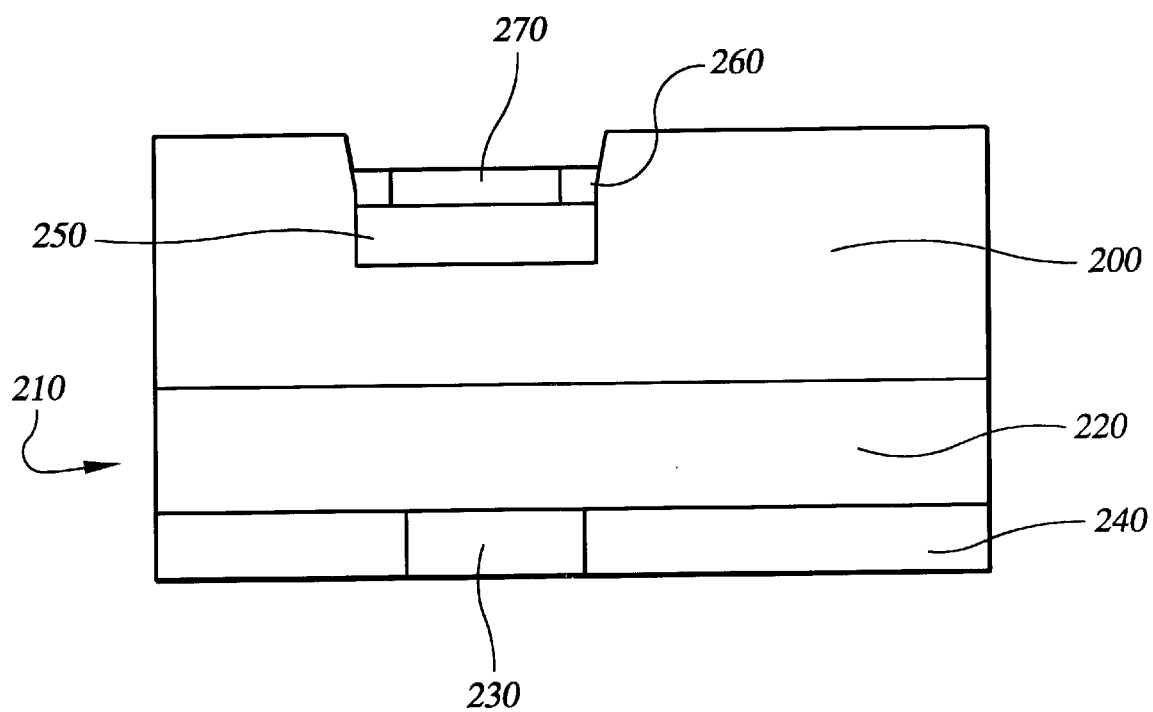
FIG. 2 is a flip-chip die with circuitry in the back side, according to another example embodiment of the present invention.

In another example embodiment of the present invention illustrated in FIG. 2, a flip-chip die having SOI structure is analyzed. A portion of a bulk silicon layer is removed without exposing the buried insulator layer. The selective removal of a portion of the bulk silicon layer 200 creates a void in the back side of the flip-chip die 210. The void extends into the bulk silicon layer 200 yet stops short of the buried insulating layer 220. Circuitry is then formed in the void created by the removal of substrate. First, an insulator is deposited unto the newly exposed surface of the thinned bulk silicon layer, and a thin film dielectric formed. An epitaxial layer is formed over the dielectric layer. As shown in FIG. 2, the resulting structure includes an epitaxial layer 240 containing pre-existing circuitry 230, a buried insulator layer 220, a bulk silicon layer 200,Ma new buried insulator layer 250, and a new epitaxial layer 260. Circuitry 270 is built into the new epitaxial layer 260.

Formation of additional insulator may be performed both when the buried insulating layer has been exposed and when it has not been exposed by the back side substrate removal. The formation of additional insulator is performed in a variety of ways applicable to both instances. One method which encompasses a variety of techniques is chemical vapor deposition (CVD). In one example embodiment, a vapor deposition step is performed followed by an annealing step. In another, a plasma deposition technique is utilized. Still another example method of insulator formation is sputtering amorphous silicon into the void created by substrate removal and oxidizing the silicon by exposure to a wet ambient environment at temperatures between 800°–1000° C.

In another example embodiment, a flip-chip die is locally thinned in a selected area of the back side of a die having a buried oxide layer (BOX), exposing the back side of the BOX. In many common SOI applications, the BOX is approximately 400 nanometers thick. Additional insulator is added to the BOX to thicken it to approximately 10–100 microns. A scanning pulsed laser, such as a femto laser, is used to perform the thickening of the BOX through a laser annealing process. A silicon epitaxial layer is formed above the expanded BOX layer and circuitry is formed in the epitaxial layer. The formed circuitry contains one or more of spare gates, spare memory cells, and programmable circuitry circuits. Each piece of formed circuitry may be selectively activated. The formed circuitry is coupled to the pre-existing circuitry and used as desired to modify and/or test the die.

Figure 3:
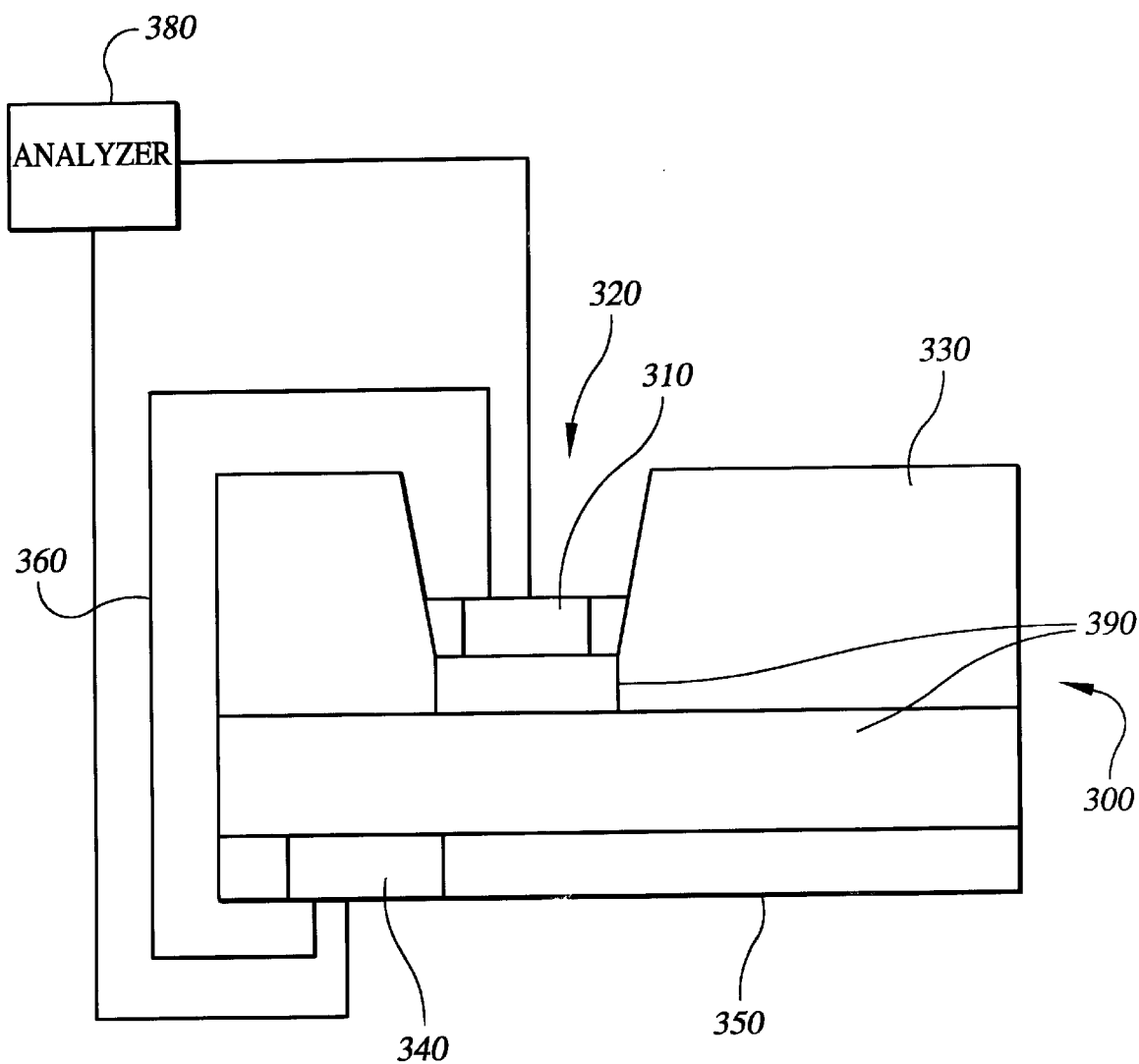
FIG. 3 is a flip-chip die with circuitry in the back side coupled to circuitry on the circuit side, according to another example embodiment of the present invention.

In another example embodiment, illustrated in FIG. 3, circuitry 310 formed in a void 320 on the back side of the die is electrically coupled to circuitry 340 on the circuit side 350 of the die 300 by a conductor 360. The conductor 360, first connected to an electrical lead on the circuit side 350 of the die, is extended along the outside of the die from the circuit side to the back side where it is contacted to an electrical lead on the circuitry newly formed upon a thickened buried insulator layer 390. As shown in FIG. 3, multiple connections may be made. Additionally, coupling the new and old circuitry may include coupling them through an analysis device 380 whereby the analysis device makes use of both pieces of circuitry for die analysis.

In another example embodiment, the circuitry formed in a back side void is capacitively coupled to the circuitry located on the circuit side of the die. The operation of the back side circuitry creates a capacitance effect in the circuit side circuitry which is manipulated to force the circuit side circuitry to undergo a change in voltage, current, or other electrical power parameter.

Figure 4A:
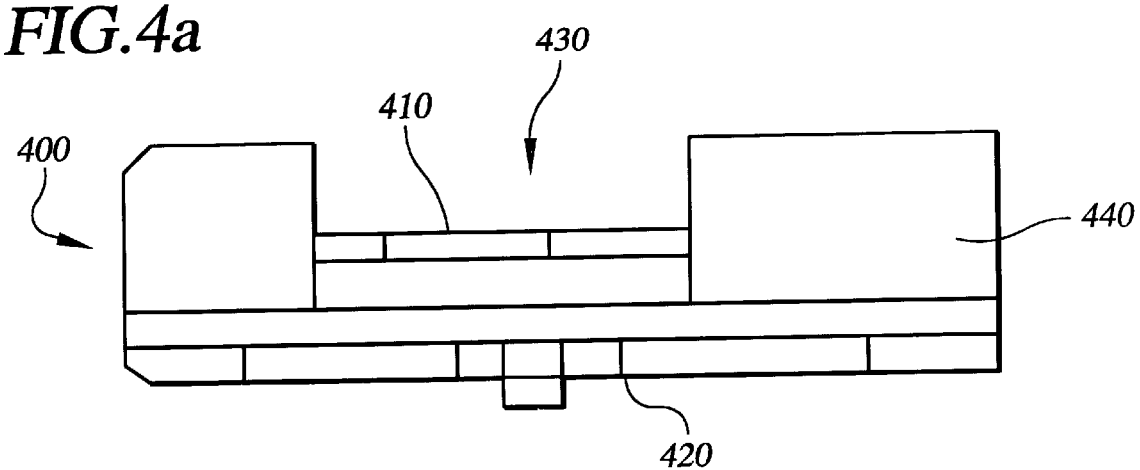
FIG. 4A is a flip-chip die with circuitry in the back side, according to another example embodiment of the present invention.
Figure 4B:
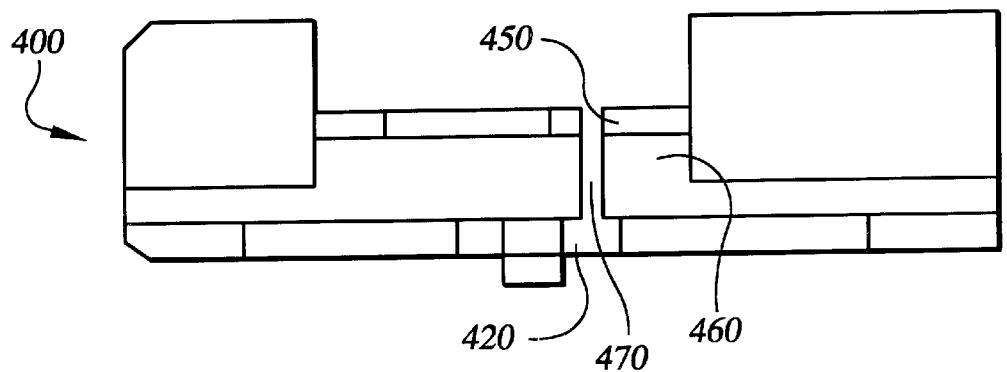
FIG. 4B is a flip-chip die with circuitry in the back side undergoing coupling to circuitry on the circuit side, according to another example embodiment of the present invention.
Figure 4C:
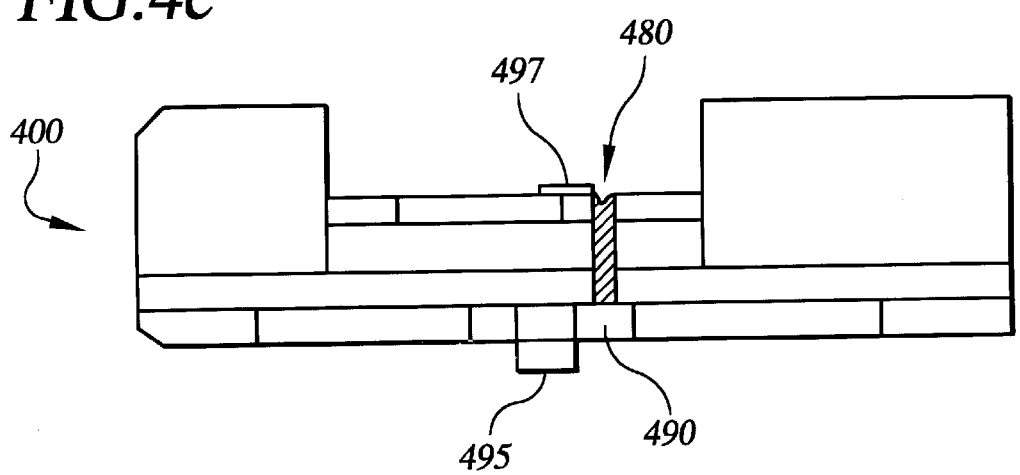
FIG. 4C is a flip-chip die with circuitry in the back side undergoing coupling to circuitry on the circuit side, according to another example embodiment of the present invention.

In another example embodiment, shown in FIGS. 4a–c, the coupling of the back side circuitry 410 to the circuit side circuitry 420 is demonstrated. FIG. 4a shows the formed integrated circuit die having newly formed back side circuitry 410 formed in a void 430 created by localized thinning of a back side bulk silicon layer 440.

A hole is milled through the die 400 between the two areas of circuitry in FIG. 4b. Milling of the die may be performed by an FIB etch, or by other well known means. The hole is milled through a back side epitaxial silicon layer 450, a buried insulator layer 460 that has been thickened, and into the circuitry 420 on the circuit side of the die.

The milled hole is filled with a conductive material 480 that is extended to contact the desired parts of the two regions of circuitry in FIG. 4c. A conductive wire lead, or other means of conducting electrical signals, may be required to extend the conductor to the desired portion of circuitry. The connection between the circuits may include contacting a specific portion of a circuit, for example a source/drain region 490, a gate 495, an interconnect (not shown), or a bonding pad (not shown). The two regions of circuitry are thereby coupled.

Figure 5:
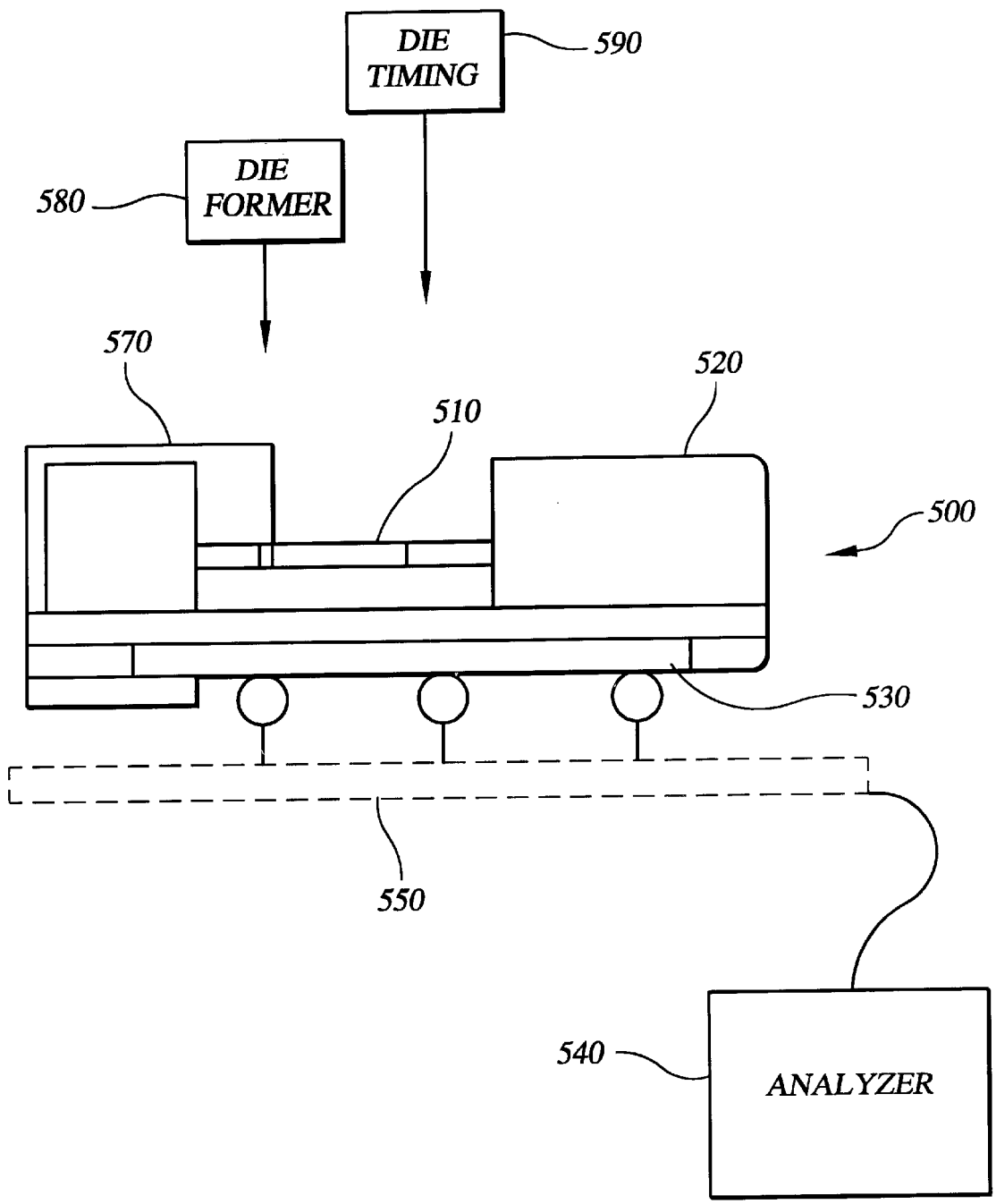
FIG. 5 is a system for analysis of a flip-chip die, according to another example embodiment of the present invention.

One example embodiment of the present invention is a system for flip-chip die analysis. The back side 510 of a flip chip die 500 is selectively thinned by a substrate removal device 590 in FIG. 5. A circuit formation arrangement 580, including conventional circuitry construction devices, is adapted to form circuitry in a void created by removal of the substrate 520. Analysis of the die 500 is performed using the newly formed circuitry 510 in the back side void of the die. An analysis device 540 is adapted to send a stimulus through an interface device 550 to the circuit side circuitry 530. The back side circuitry 510 includes a spare gate, a spare memory cell, and a selectively activatable spare circuit which are selected as needed for analysis. A connection between the back side and circuit side circuitry is formed via a conductive wire 570 between the two.

When a defect is determined to exist, yet the location is unknown, the die is operated in a manner such that circuitry suspected of containing a defect is replaced by corresponding circuitry 510 constructed in a back side. The new circuitry is used to replace pre-existing circuitry in the die suspected of containing a defect to either positively or negatively confirm the existence of the suspected defect. In another implementation, the circuitry 510 constructed in the back side is adapted to stimulate existing circuitry in the die, and in another implementation the circuitry is adapted to be used as circuitry in addition to the existing circuitry.

While the present invention has been described with reference to several particular example embodiments, those skilled in the art will recognize that many changes may be made thereto without departing from the spirit and scope of the present invention, which is set forth in the following claims.

What is claimed is:

1. A method for post manufacturing analysis of a semiconductor die having a buried insulator layer and a circuit side opposite a back side, the method comprising:

removing substrate from a selected portion of the back side and forming a void therein;

forming a circuit in the void and over the insulator layer;

coupling the formed circuit to circuitry in the circuit side of the die; and using the formed circuit and analyzing the die.

2. The method of claim 1, wherein removing substrate includes exposing the buried insulator, and wherein forming a circuit in the void includes forming the circuit on the exposed insulator and using the formed circuitry and the exposed insulator to form SOI structure.

3. The method of claim 1, wherein a buried insulator includes a buried oxide layer (BOX).

4. The method of claim 1, wherein forming a circuit includes forming additional insulator material above the buried insulator and forming the circuit over the additional insulating material.

5. The method of claim 4, wherein forming additional insulator material includes forming silicon dioxide.

6. The method of claim 4, wherein forming additional insulator material includes using a femto laser.

7. The method of claim 4, wherein forming additional insulator material includes chemical vapor deposition of insulator material into the void created by removing silicon substrate.

8. The method of claim 4, wherein forming additional insulator material over the buried insulator includes increasing the thickness of the buried insulator layer to approximately 10–100 microns.

9. The method of claim 1, wherein forming a circuit includes forming an insulator layer, forming an epitaxial silicon layer over the insulator layer and forming circuitry on the epitaxial layer.

10. The method of claim 1, wherein forming a circuit includes forming at least one of: a transistor, a memory cell, a programmable circuitry circuit, and a selectively activatable circuit.

11. The method of claim 1, wherein coupling a formed circuit to other circuitry in the die includes forming an electrical connection from the formed circuit to the other circuitry in the die.

12. The method of claim 1, wherein coupling the formed circuit to other circuitry in the die comprises:

removing substrate from the die between the formed circuit and the other circuitry and forming a void; and depositing conductive material in the void.

13. The method of claim 1, wherein using the formed circuit to analyze the die includes replacing a defective circuit in the die.

14. The method of claim 1, wherein using the formed circuit to analyze the die includes replacing a circuit damaged while analyzing the die.

15. The method of claim 1, wherein analyzing the die includes using the formed circuit to stimulate the die.

16. The method of claim 1, wherein analyzing the die includes using the formed circuit to bias a gate in the die.

17. The method of claim 1, wherein analyzing the die includes using the formed circuit to replace a circuit in the die suspected of causing a failure within the die.

18. An arrangement for analyzing an integrated circuit die having a buried insulator layer between a circuit side and a back side, the arrangement comprising:

means for removing substrate from a selected portion of the integrated circuit die forming a void;

means for forming a circuit in the void produced by removal of the substrate;

means for electrically coupling the formed circuit to the circuitry in the die; and means for using the formed circuit and for analyzing the die.

19. A system for analyzing an integrated circuit die having a buried insulator layer between a circuit side and a back side, the system comprising:

a thinning arrangement adapted to remove a selected portion of substrate from an integrated circuit die forming a void;

a construction arrangement adapted to construct circuitry in the void produced by removal of the substrate and to couple the constructed circuit to the circuitry in the die; and an analysis arrangement adapted to use the newly constructed circuitry and to perform analysis of the die.

20. The system of claim 19, wherein the construction arrangement is adapted to form an insulator layer in the void produced by removal of the substrate.

21. The system of claim 20, wherein the construction arrangement includes a femto laser.

22. The system of claim 19, wherein the construction arrangement is adapted to deposit conductive material that electrically couples the newly formed circuitry and the existing circuitry of the die.

* * * * *